United States Patent [19]

Rodder

[11] Patent Number: 5,504,359
[45] Date of Patent: Apr. 2, 1996

[54] VERTICAL FET DEVICE WITH LOW GATE TO SOURCE OVERLAP CAPACITANCE

[75] Inventor: Mark S. Rodder, Dallas, Tex.

[73] Assignee: Texas Instruments Incorporated, Dallas, Tex.

[21] Appl. No.: 369,851

[22] Filed: Jan. 6, 1995

Related U.S. Application Data

[63] Continuation of Ser. No. 176,983, Jan. 3, 1994, abandoned, which is a continuation of Ser. No. 15,273, Feb. 8, 1993, abandoned, which is a continuation of Ser. No. 778,426, Oct. 16, 1991, abandoned, which is a division of Ser. No. 606,674, Oct. 31, 1990, Pat. No. 5,087,581.

[51] Int. Cl.$^6$ .................. H01L 29/76; H01L 27/108; H01L 29/94; H01L 31/062
[52] U.S. Cl. .................. 257/329; 257/302; 257/330; 257/344; 257/408
[58] Field of Search .................. 357/23.1, 23.3, 357/23.4; 257/302, 329, 344, 408, 330

[56] References Cited

U.S. PATENT DOCUMENTS

| 4,954,854 | 9/1990 | Dhong et al. | 357/23.4 |
| 5,001,526 | 3/1991 | Gotou | 357/23.4 |
| 5,047,812 | 9/1991 | Pfiester | 357/23.4 |
| 5,057,896 | 10/1991 | Gotou | 357/23.5 |
| 5,060,029 | 10/1991 | Nishizawa et al. | 357/23.4 |
| 5,073,519 | 12/1991 | Rodder | 357/23.4 |

FOREIGN PATENT DOCUMENTS

| 59-204280 | 11/1984 | Japan | 357/23.4 |
| 60-189962 | 9/1985 | Japan | 357/23.4 |
| 63-244683 | 10/1988 | Japan | 357/23.3 |
| 63-296281 | 12/1988 | Japan | 357/23.4 |
| 1-268172 | 10/1989 | Japan | 357/23.4 |
| 1-293666 | 11/1989 | Japan | 357/23.4 |

OTHER PUBLICATIONS

Semiconductor Devices–Physics and Technology, Jan. 1985, by S. M. Sze, p. 362.

*Primary Examiner*—Steven H. Loke
*Attorney, Agent, or Firm*—Dana L. Burton; James C. Kesterson; Richard L. Donaldson

[57] ABSTRACT

This is a vertical MOSFET device with low gate to source overlap capacitance. It can comprise a semiconductor substrate 22 of the first conductivity type, a source region 24,26 of a second conductivity type formed in the upper surface of the substrate 22; a vertical pillar with a channel region 28 of the first conductivity type, a lightly doped drain region 30 of the second conductivity type and a highly doped drain contact region 32 of the second conductivity type; a gate insulator 34, a gate electrode 36 surrounding the vertical pillar, and an insulating spacer 38 between the source 24,26 and a portion of the gate 36 regions. This is also a method of forming a vertical MOSFET device on a single crystal semiconductor substrate, with the device having a pillar on the substrate, with the pillar having a channel region in a lower portion and with the channel region having a top and a highly doped first source/drain region in an upper portion of the pillar, with the substrate having a highly doped second source/drain region and with a gate insulator on the substrate and on the pillar. The method comprises: isotropically forming a first gate electrode material layer on the pillar and the substrate; anisotropically etching the first gate electrode material leaving a vertical portion of gate electrode material on the pillar; anisotropically depositing an insulating spacer; and conformally depositing a second gate electrode material layer.

8 Claims, 5 Drawing Sheets

VERTICAL FET DEVICE WITH LOW GATE TO SOURCE OVERLAP CAPACITANCE

This application is a continuation of application Ser. No. 08/176,983, filed Jan. 3, 1994, now abandoned, which is a continuation of Ser. No. 08/015,273, filed Feb. 8, 1993, which is a continuation of Ser. No. 07/778,426, filed Oct. 16, 1991, now abandoned which is a divisional of Ser. No. 07/606,674, filed Oct. 31, 1990, now U.S. Pat. No. 5,089,581.

NOTICE (C) Copyright, *M* Texas Instruments Incorporated 1990. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

FIELD OF THE INVENTION

This invention generally relates to semiconductor fabrication methods and devices.

BACKGROUND OF THE INVENTION

The trend in the semiconductor industry is toward smaller devices so that higher density circuits can be fabricated on a single chip. The miniaturization of transistor devices and circuits can be achieved in the field effect transistor (FET) family of circuits partly by reducing the size of the various masks used in the semiconductor fabrication process. This technique is termed "scaling" and is implemented by reducing the size of all the features of the surface-oriented devices so that the resultant devices occupy a smaller surface area of the wafer.

In order to achieve devices with higher packing density, it is important to shrink not only the channel length but also the channel width for the planar transistor. However, planar narrow width transistors exhibit problems such as, threshold voltage variation, increase of substrate-bias effect due to impurity concentration enhancement in the channel region, and reliability degradation by hot-carriers. The narrow width transistors also cause decrease of current drivability and reliability degradation due to the large electric field at the LOCOS edge. To realize a high packing density without reducing a feature size, such as channel width, vertical transistors have been fabricated. In the vertical transistor the gate electrode surrounds a pillar of silicon whose sidewalls are used as the channel. Since the pillar can have four sides, it is noted that the channel width of the vertical transistor can be four times that of a planar transistor occupying the same silicon area. Other advantages of a vertical transistor include ease of forming a short channel length transistor without severe lithography constraints as in the fabrication of a short channel length planar transistor.

SUMMARY OF THE INVENTION

This is a vertical FET device with a semiconductor pillar. The device comprises: a highly doped source region in a semiconductor substrate; a channel region in the pillar; a highly doped drain region in the pillar above the channel region; a gate adjacent to the channel region; an insulating spacer between at least a portion of the gate and the highly doped source region; and a gate insulator between the gate and the channel region, whereby the insulating spacer reduces gate to source capacitance.

Preferably the device has a lightly doped drain region in the pillar below the highly doped drain region; a lightly doped source region; and the pillar is above the lightly doped source region but not substantially above the highly doped source region.

This is also a method of forming a vertical MOSFET device on a semiconductor substrate, with the device having a pillar on the substrate, with the pillar having a channel region in a lower portion and with the channel region having a top and a highly doped first source/drain region in an upper portion of the pillar, with the substrate having a highly doped second source/drain region and with a gate insulator on the substrate and on the pillar. The method comprises: isotropically forming a first gate electrode material layer on the pillar and the substrate; anisotropically etching the first gate electrode material leaving a vertical portion of gate electrode material on the pillar; anisotropically depositing an insulating spacer; and conformally depositing a second gate electrode material layer.

Preferably the device has, in the pillar, a highly doped drain contact region over a lightly doped drain region which is in turn over a channel region and the first and second gate electrode materials are isotropically etched to produce a top level of the gate electrode material which is essentially below the highly doped drain contact region but above the channel region, whereby the insulating spacer reduces gate to source capacitance and the gate not being substantially adjacent to the highly doped drain region reduces gate to drain capacitance.

FIG, 4 is a flow diagram of process steps shown in FIG, 3;

DETAILED DESCRIPTION OF PREFERRED EMBODIMENTS

Figure 1:
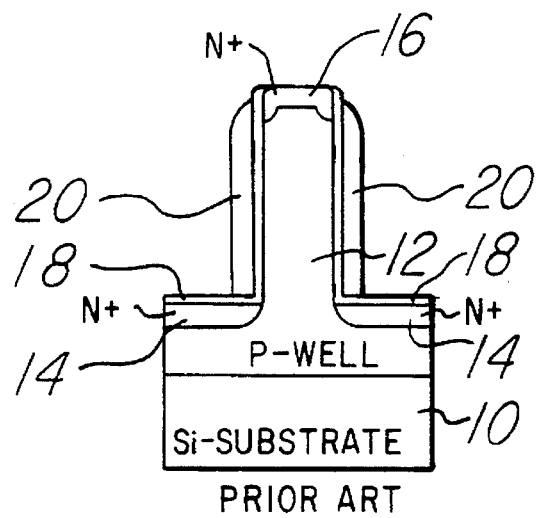
FIG. 1 is a cross-sectional view of a prior art vertical MOSFET.

In FIG. 1, an example of a prior art vertical MOSFET is shown. The transistor has a silicon substrate 10 under a pillar of silicon 12, implanted with highly doped source 14 and drain 16 regions. The sidewalls of the pillar 12 are the channel region. There is a thin layer of oxide 18 on the pillar 12 sidewalls and over the source region 14. The pillar 12 sidewalls are surrounded by the gate electrode 20. The extension of the gate electrode 20 over the highly doped drain region 16 results in significant gate-to-drain capacitance. The thinness of the layer of oxide 18 between the gate electrode 20 and the source region 14 results in significant gate-to-source capacitance when the gate electrode 20 is necessarily extended over the source region 14 in order to provide for a region of the gate electrode 20 to which contact may be made.

Figure 2:
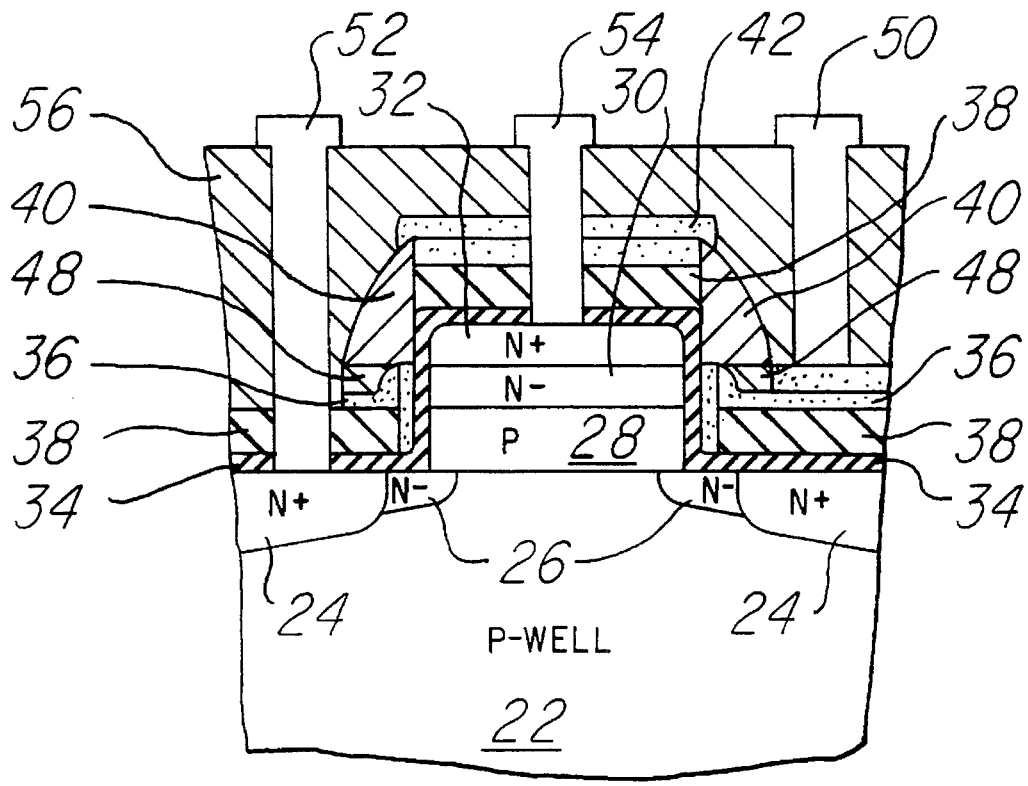
FIG. 2 is a cross-sectional view of a preferred embodiment of this invention.

FIG. 2 illustrates a preferred embodiment of the present invention. The vertical transistor shown has a single crystal silicon substrate 22 with a highly doped (N+) 24 and a lightly doped (N−) 26 source region and a pillar. The pillar has an N+ drain contact region 32, an N− drain region 30, and a channel region 28. The source and drain regions of such a transistor are generally interchangeable. The device is covered with a grown silicon oxide (oxide) layer 34. A doped polycrystalline silicon (poly) gate electrode 36 surrounds the pillar. There is a thick layer of oxide 38 (insulating spacer) between a portion of the gate electrode 36 and the source region 24,26 to reduce gate-to-source capacitance. The gate electrode 36 does not substantially extend above the N−drain region 30, resulting in essentially no overlap and thus very little capacitance between the N+ drain contact region 32 and the gate electrode 36. The transistor has sidewall oxides 40 and thick exposed sections of gate electrode 36 and contact hole etch stop layer 42 (for ease of contact formation). This device is generally made in a ring-shaped formation.

Figure 3A:
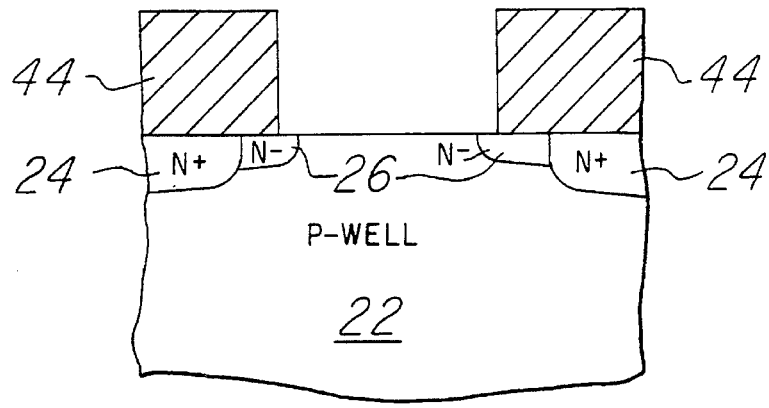
FIGS. 3a–h are cross-sectional views of a wafer during sequential processing steps in which the device, shown in FIG. 2, is formed.
Figure 3B:
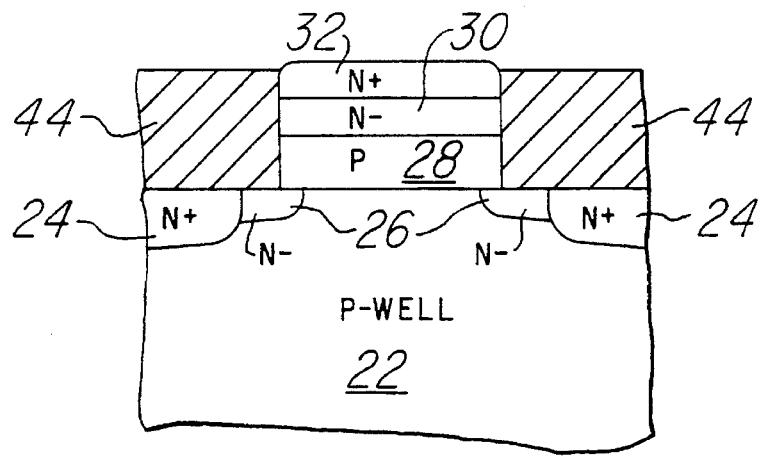
Figure 3C:
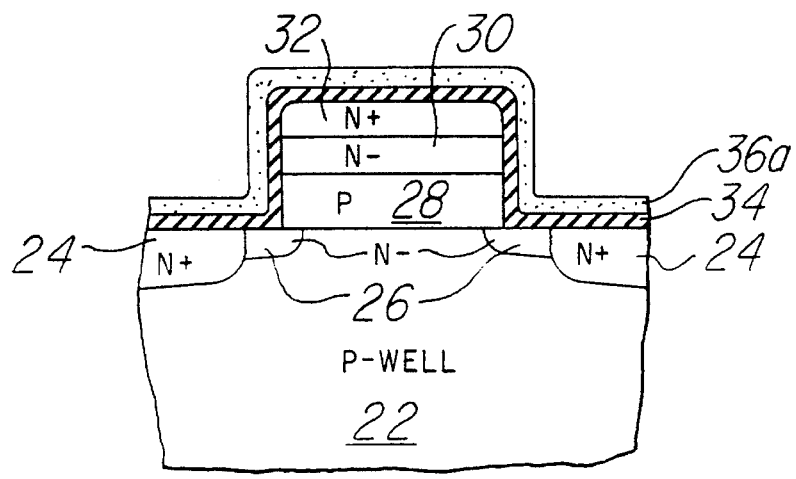
Figure 3D:
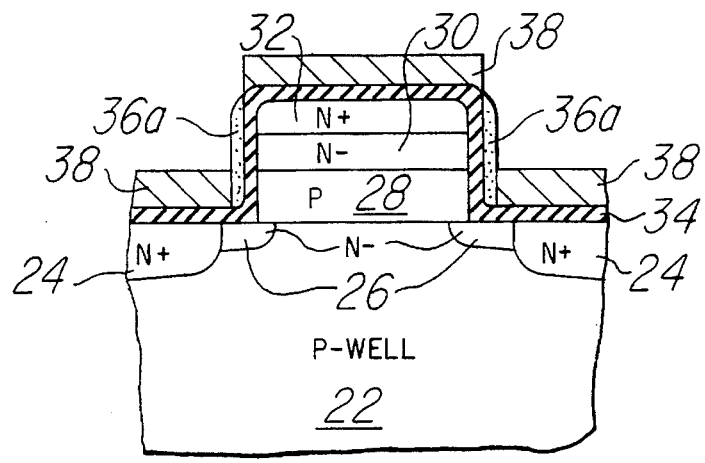

A method of making the transistor shown in FIG.2 will now be described with reference to FIGS. 3a–3h. An n-type device is shown, however, the following technique is also compatible with p-type devices. The structure in FIG. 3a is formed by using any appropriate masking and doping processes. The source doping illustrated here has both N+ 24 and N− 26 regions. However, the exact doping level can be tailored for each specific application. An oxide layer 44 is deposited, and the silicon 22 is exposed only where formation of the vertical transistor pillar is desired. Referring to FIG. 3b, the pillar is formed with a channel region 28, an N− drain region 30, and an N+ drain contact region 32. The transistor pillar is preferably formed by an appropriately selective growth process such as a low temperature silicon epitaxy process. The masking oxide 44 is removed. A gate oxide layer 34 can be formed over the entire wafer followed by an isotropic deposition of a thin layer of gate electrode material 36a such as poly. The result is shown in FIG. 3c.

Figure 3E:
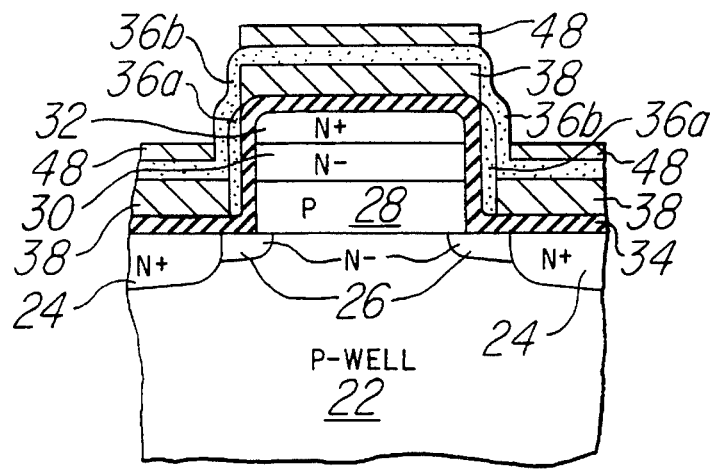
Figure 3F:
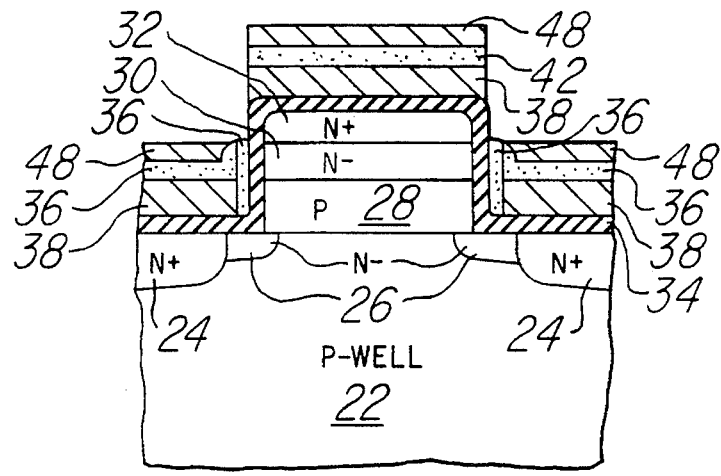

The poly layer 36a is anisotropically etched to form sidewalls along the vertical transistor pillar. An anisotropic oxide deposition process (ref. U.S. Pat. No. 4,894,352) forms an oxide layer 38 over the drain 30,32 and source 24,26 regions. If necessary, a light oxide etch can be done to achieve the desired formation shown in FIG. 3d. Although not shown, a contact hole may be etched through oxide layers 38 and 34 to the highly doped drain region 32, or oxide layers 38 and 34 may be removed completely from the top of the pillar, prior to subsequent processing. A second thin layer of gate electrode material 36b, such as poly, is isotropically deposited over the wafer. The vertical portions of the two layers of poly 36a,36b partially overlap as shown in FIG. 3e. A layer of oxide 48 is anisotropically deposited to form a mask for the next step. The layer of oxide 48 should not substantially extend above the N− drain region 30. If necessary, a light oxide etch can be done to achieve the formation in FIG.3e. An isotropic structure illustrated in FIG. 3f. Note that the poly! 36, left on the sidewall should end somewhere in the N− drain region 30, preferably near the top, and should not substantially extend into the N+ drain contact region 32. However, though it may be preferable-for the gate electrode 36 to overlap the N− drain region 30, it is only necessary that it overlap the channel region 28. Poly is left above the drain to serve as an etch stop layer 42. Note that if a contact hole was etched through oxide layers 38 and 34 above the highly doped drain region 32 or these layers were removed completely from the top of the pillar, prior to deposition of layer 36b, layer 42 would be in contact with region 32 in FIG. 3f.

Figure 3G:
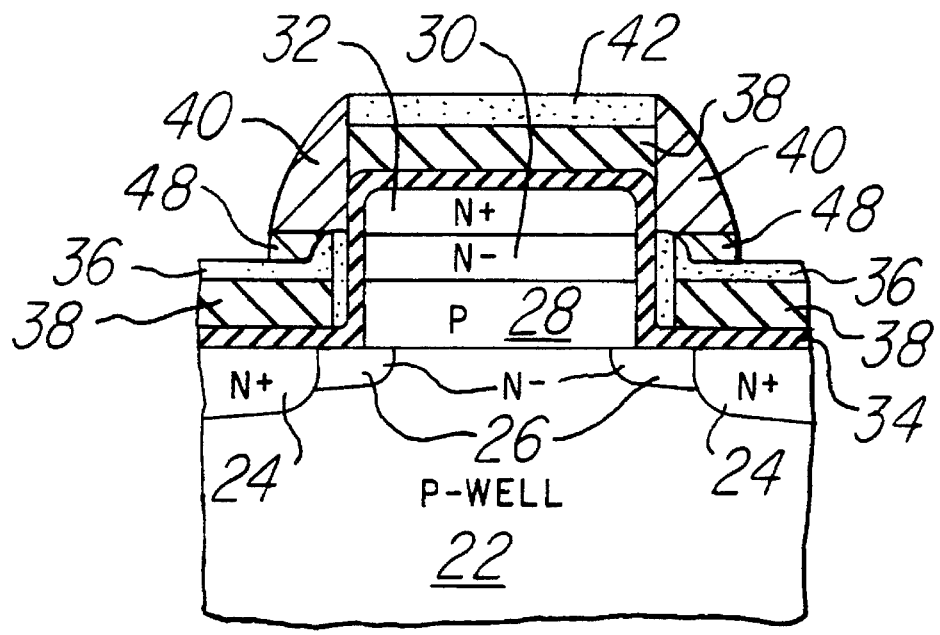
Figure 3H:
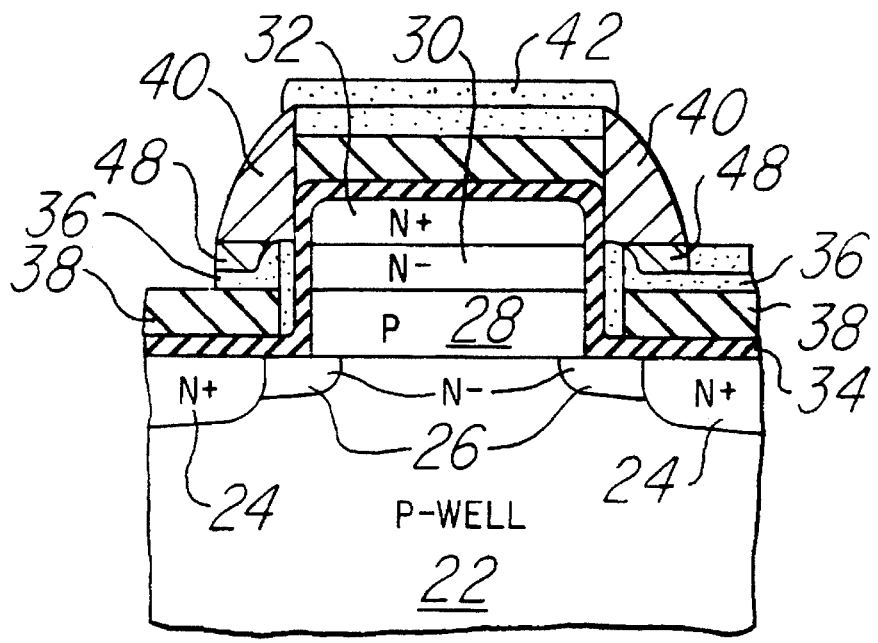

Oxide sidewalls 40 may be formed as seen in FIG. 3g which results in removal of undesired portions of oxide layer 48. A portion of the gate electrode 36 over the source region 24,26 is etched to allow contact to source 52. Poly is selectively deposited to thicken the gate electrode 36 and etch stop layer 42 to facilitate ease of contact formation. The thickened gate electrode 36 allows simultaneous gate 50 and source 52 contact formation without fear of overetching the gate region 36. The self-aligned etch stop layer 42 allows for ease of contact to drain 54 reducing drain junction leakage (e.g. oxide etch of contact hole to approximately top or slightly below top of etch stop layer, then poly etch and oxide etch if the etch stop layer 42 is not in contact with the highly doped drain region 32). A layer of interlevel oxide 56 is deposited over the entire transistor followed by contact formation 50,52,54 resulting in the vertical MOSFET shown in FIG. 2.

Typically, the channel region 28 is 500–5000 Å, the lightly doped drain region 30 is 1000–2000 Å, and the highly doped drain contact region 32 is 1000–3000 Å. The sum of the oxide layers 34, 38, and 48, and the second gate electrode layer 36b are approximately equal to or less than the sum of the heights of the channel region 28 plus the lightly doped drain region 30. Usually, the gate oxide layer 34 is 40–200 Å, the insulating spacer 38 is greater than 300 Å and the second gate electrode layer 36b is 200–500 Å. The thickness of the oxide masking layer 48 is the difference needed to achieve the desired total height after the other three layer thicknesses are summed.

Figure 4:
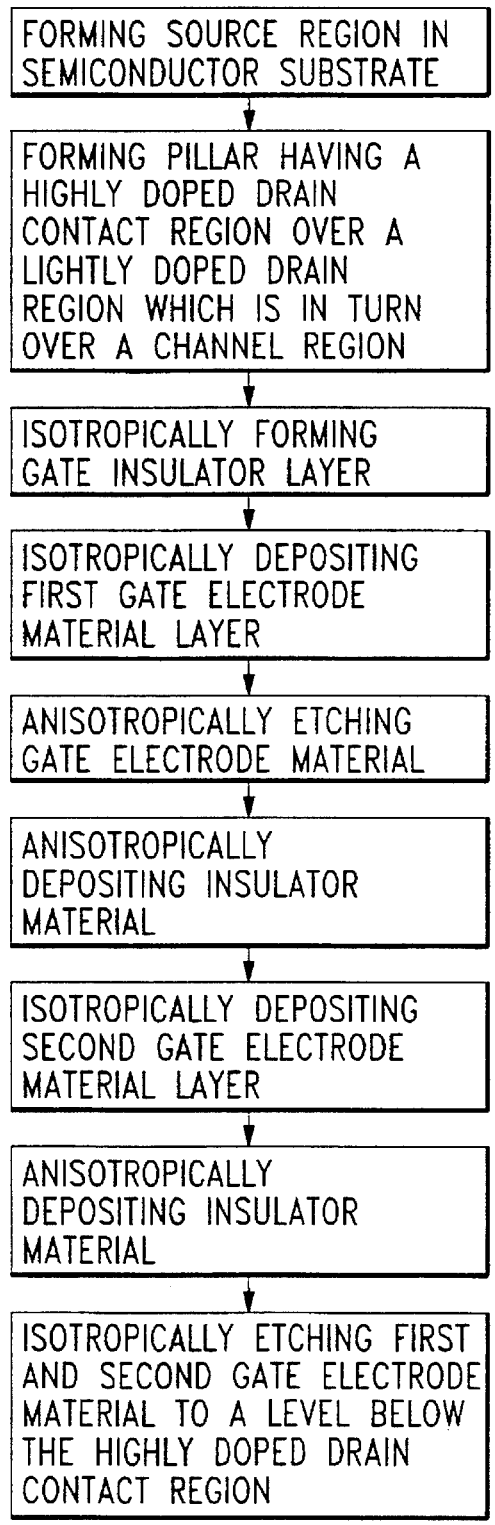

FIG. 4 shows the flow of process steps up to the isotropic etch of the gate electrode. This process produces a vertical transistor with low gate-to-drain and low gate-to-source overlap capacitances. The gate-to-drain capacitance is minimized by reducing the overlap of the gate electrode with the highly doped drain contact region. The gate-to-source capacitance is lowered by putting a thick insulating spacer between a portion of the gate electrode and the source region. This process forms a structure with small capacitances with a minimum number of masking steps. The lower overlap capacitances translates into increased device speed.

A preferred embodiment has been described in detail hereinabove. It is to be understood that the scope of the invention also comprehends embodiments different from those described, yet within the scope of the claims.

For example, while the substrate used is referred to as silicon, it could be any appropriate semiconductor material, such as GaAs. Similarly, the oxide can be any insulator, and the gate electrode can be any conductor, that can be etched and deposited to achieve the desired results.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A vertical FET device with a semiconductor pillar, said device comprising:

a. a source region in a semiconductor substrate;

b. a channel region in said pillar;

c. a drain region in said pillar above said channel region;

d. a gate electrode surrounding said pillar, said gate electrode comprising a vertical portion adjacent said channel region and a horizontal extension adjacent said vertical portion;

e. a thick insulating spacer over said source region and under said horizontal extension of said gate electrode, said insulating spacer having a vertical sidewall directly contacting and adjacent to part of a vertical side of said vertical portion of said gate electrode; and f. a gate insulator formed directly on said channel region between said gate electrode and said channel region, wherein said thick insulating spacer is substantially thicker than said gate insulator.

2. The device of claim 1, wherein said drain region comprises a lightly doped drain region in said pillar below a highly doped drain region.

3. The device of claim 1, wherein said source region comprises a highly doped source region and a lightly doped source region.

4. The device of claim 3, wherein said pillar extends over said lightly doped source region but not over said highly doped source region.

5. The device of claim 1, wherein said substrate is silicon.

6. The device of claim 1, wherein said insulating spacer is oxide.

7. The device of claim 1, wherein said gate is polysilicon.

8. The device of claim 1, wherein said device has a self-aligned etch stop layer above said drain region.

* * * * *